(12) United States Patent
Fu et al.

(10) Patent No.: US 9,184,908 B2
(45) Date of Patent: Nov. 10, 2015

(54) APPARATUS AND METHOD FOR REDUCING JITTER IN PERIODIC SIGNALS

(71) Applicant: iWatt Integrated Circuits Technology (Tianjin) Limited, Tianjin (CN)

(72) Inventors: Liman Fu, Tianjin (CN); Nailong Wang, Beijing (CN)

(73) Assignee: iWatt Integrated Circuits Technology (Tianjin) Limited, Tianjin (CN)

( * ) Notice: Subject to any disclaimer, the term of this patent is extended or adjusted under 35 U.S.C. 154(b) by 0 days.

(21) Appl. No.: 14/097,046

(22) Filed: Dec. 4, 2013

(65) Prior Publication Data

US 2014/0161216 A1 Jun. 12, 2014

(30) Foreign Application Priority Data

Dec. 6, 2012 (CN) .......................... 2012 1 0524571

(51) Int. Cl.
*H04L 7/00* (2006.01)
*H04L 7/02* (2006.01)
*G01S 17/10* (2006.01)
*G02B 27/48* (2006.01)
*G01S 7/483* (2006.01)
*H03L 7/00* (2006.01)

(52) U.S. Cl.
CPC . *H04L 7/02* (2013.01); *G01S 7/483* (2013.01); *G01S 17/10* (2013.01); *G02B 27/48* (2013.01); *H03L 7/00* (2013.01)

(58) Field of Classification Search
CPC ......... G01S 17/10; G01S 7/483; G02B 27/48; H03L 7/00
USPC .......................................... 375/371; 235/454
See application file for complete search history.

(56) References Cited

U.S. PATENT DOCUMENTS

| 5,696,859 A | * | 12/1997 | Onaka et al. ..................... 385/24 |
| 5,835,676 A | * | 11/1998 | Komatsu et al. ............... 388/811 |
| 6,005,425 A | * | 12/1999 | Cho .............................. 327/156 |
| 2003/0173909 A1 | | 9/2003 | Danjo et al. |

(Continued)

FOREIGN PATENT DOCUMENTS

| CN | 1519934 A | 8/2004 |
| CN | 102073033 A | 5/2011 |
| CN | 203086781 U | 7/2013 |

OTHER PUBLICATIONS

State Intellectual Property Office of the People's Republic of China, First Office Action, Chinese Patent Application No. 201210524571. 6, May 6, 2015, thirteen pages.

*Primary Examiner* — Leila Malek
(74) *Attorney, Agent, or Firm* — Fenwick & West LLP

(57) ABSTRACT

The present invention provides an apparatus and method for reducing jitter in a periodic signal. The apparatus comprises: a frequency discriminator configured to receive the periodic signal and feedback of an output signal of the apparatus and calculate an estimate value for a length of a current period of the periodic signal; a phase discriminator configured to receive the periodic signal and determine an adjustment factor for the length of the current period of an input signal according to the input signal in a previous period of the periodic signal and the output signal in the previous period of the apparatus; and an adjustor configured to determine the period length of the output signal in the current period according to the estimate value for the length of the current period and the adjustment factor for the length of the current period.

14 Claims, 2 Drawing Sheets

(56) References Cited

U.S. PATENT DOCUMENTS

| | | |
|---|---|---|
| 2004/0135604 A1 | 7/2004 | Lee |
| 2006/0114468 A1* | 6/2006 | Kataoka .................. 356/450 |
| 2008/0219295 A1* | 9/2008 | Umehara et al. .............. 370/512 |
| 2011/0280109 A1* | 11/2011 | Raymond .................. 368/46 |

* cited by examiner

APPARATUS AND METHOD FOR REDUCING JITTER IN PERIODIC SIGNALS

FIELD OF THE INVENTION

Embodiments of the present invention relate to de-jittering of periodic signals, and more specifically to an apparatus and method for reducing jitter in a vertical synchronous (VSYNC) signal for an LED driver.

BACKGROUND OF THE INVENTION

An LED (Light Emitting Diode) is a semiconductor device capable of converting electrical energy to optical energy. An LED driver refers to a power supply adjusting electronic device for driving the LED to emit light or driving an LED module assembly to operate normally. A universal LED driver is generally designed and provided by special companies. These companies modularize it and then provide it to an LED terminal application product manufacturer for use. However, as for some specific applications, such a universal module might not be applicable or cannot work very well. For example, some periods of a vertical synchronous signal provided by the universal LED driver module might have ±5% jitter as compared with a standard signal. In some cases, this jitter amplitude is too large and the signal cannot be directly used.

Therefore, there is a need for re-shaping the vertical synchronous signal for the LED driver so as to reduce or remove jitter thereof.

SUMMARY OF THE INVENTION

In view of the above, the present specification provides an apparatus and method for reducing jitter in a vertical synchronous signal for an LED driver. More generally, since any periodic signal may not be a completely ideal periodic signal, the method and apparatus according to the present invention can further be used to reduce jitter in any periodic signal.

According to one aspect of the present invention, there is provided an apparatus for reducing jitter in a periodic signal. The apparatus comprises: a frequency discriminator configured to receive the periodic signal and feedback of an output signal of the apparatus and calculate an estimate value for a length of a current period of the periodic signal; a phase discriminator configured to receive the periodic signal and determine an adjustment factor for the length of the current period of an input signal according to the input signal in a previous period of the periodic signal and the output signal in the previous period of the apparatus; and an adjustor configured to determine the period length of the output signal in the current period according to the estimate value for the length of the current period and the adjustment factor for the length of the current period.

According to another aspect of the present invention, there is provided a method for reducing jitter in a periodic signal, comprising: receiving the periodic signal and feedback of an output signal and calculating an estimate value for a length of a current period of the periodic signal; receiving the periodic signal and determining an adjustment factor for the length of the current period of an input signal according to the input signal in a previous period of the periodic signal and the output signal in the previous period of the feedback; and determining the period length of the output signal in the current period according to the estimate value for the length of the current period and the adjustment factor for the length of the current period.

By using the method and apparatus according to embodiments of the present invention, the input periodic signal can be re-shaped to reduce or remove its jitter so that the output periodic signal can follow the input signal as close as possible.

BRIEF DESCRIPTION OF DRAWINGS

Features and advantages of the present invention will be made more apparent through the following detailed description with reference to accompanying drawings, in which.

DETAILED DESCRIPTION OF PREFERRED EMBODIMENTS

Figure 1:
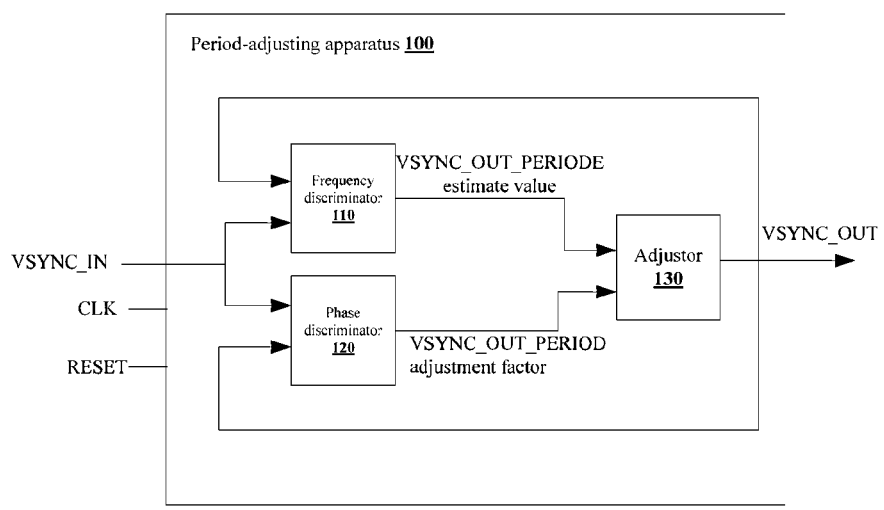
FIG. 1 illustrates a structural diagram of an apparatus for reducing jitter in a periodic signal according to an embodiment of the present invention.
Figure 2:
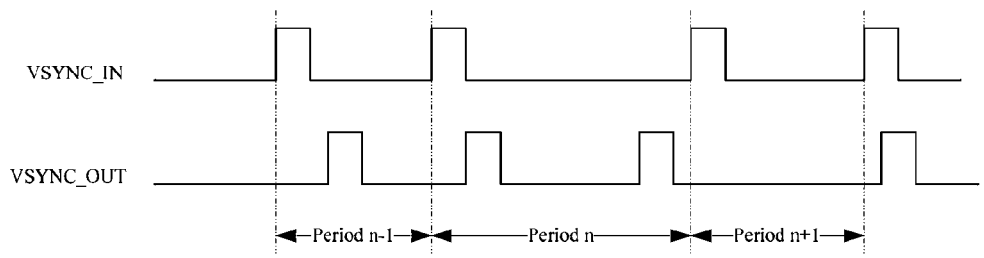
FIG. 2 illustrates a timing diagram of an input signal and an output signal of a periodic signal according to an embodiment of the present invention.

FIG. 1 illustrates a structural diagram of an apparatus 100 for reducing jitter in a periodic signal according to an embodiment of the present invention. As shown in FIG. 1, the apparatus 100 comprises a frequency discriminator 110, a phase discriminator 120 and an adjustor 130. In FIG. 1, VSYNC_IN denotes an input signal of the apparatus 100, which for example may be a vertical synchronous signal for an LED driver as described herein. However, those skilled in the art may appreciate that it may be any other periodic signals and specific uses of such periodic signals do not constitute limitations to the present invention. In the present document, the VSYNC_IN signal may be a periodic signal of any frequency. Moreover, in FIG. 1, VSYNC_OUT denotes an output signal of the apparatus 100, which is a periodic signal obtained after de-jittering of the VSYNC_IN. For example, FIG. 2 illustrates an example of VSYNC_IN and VSYNC_OUT signals.

The frequency discriminator 110 is configured to receive input of the VSYNC_IN signal and feedback of the VSYNC_OUT signal and calculate an estimate value for a length of a current period of the VSYNC_OUT. For example, the estimate value may be calculated according to the following formula:

$$\text{vsync\_period}(n)_{est} = \frac{\text{sum\_vsync\_period}(n-1)}{N} \qquad \text{Formula (1)}$$

wherein n is the current period; N is any integer greater than 1, and its value may be preset depending on precision requirements for design of the system; sum_vsync_period(n−1) is a sum of lengths of N periods before the current period. For example, when tolerance of the system for jitter in the periodic input signal is 1%, the value of N may be 1024. Besides, the value of N may be 512, 2048, 4096, etc. depending on actual precision requirements.

In one embodiment, in an initialization phase of the apparatus 100, de-jittering processing is not performed on the input in first N periods of the VSYNC_IN signal, and rather, the frequency discriminator 110 simply obtains an average value for period lengths of the N periods as the estimate value for the period length of the N+1$^{th}$ period, namely, as an initial value for estimation of subsequent period lengths.

In one embodiment, after the initial value of the estimate value for the period length is obtained by this way in the initialization phase, the frequency discriminator 110 recursively calculates the estimate value for the length of the current period by using the length of the previous period of the VSYNC_IN and the length of the previous period of the VSYNC_OUT. For example, a sum of period lengths of N periods (namely, the $n^{th}$ period and N−1 periods before the $n^{th}$ period) counted forward from the $n^{th}$ period may be recursively calculated according to the following formula (2):

sum_vsync_period($n$)=sum_vsync_period($n$−1)−
vsync_out_period($n$)+vsync_in_period($n$)   Formula (2)

wherein, vsync_in_period(n) is the period length of the $n^{th}$ period of the VSYNC_IN signal, and vsync_out_period(n) is the period length of the $n^{th}$ period of the VSYNC_OUT signal.

After the sum of period lengths of N periods counted forward from the $n^{th}$ period is recursively calculated according to the formula (2), the estimate value for the period length of the N+1$^{th}$ period may be calculated according to the formula (1).

In another embodiment, the frequency discriminator 110 may calculate the average value for lengths of an arbitrary plurality of previous periods of the VSYNC_IN signal in the initialization phase of the apparatus 100 as the initial value of the estimate value, or simply take the period length of the first period of the VSYNC_IN signal as the initial value of the estimate value, or simply take a nominal period length of the vertical synchronous signal as the initial value of the estimate value.

It can be seen from the above that the frequency discriminator 110 in this example is not a conventional frequency discriminator which allows a voltage of the output signal to correspond to a frequency of the input signal, and it may be regarded as a combination of the conventional frequency discriminator and a proportion integration differentiation (PID) controller, because the calculation (according to formula (1)) of the estimate value for the current period length actually involves integration (summation) and differentiation (averaging) operations.

The phase discriminator 120 is configured to receive the input of the VSYNC_IN signal and the feedback of the VSYNC_OUT signal, and determine an adjustment factor for the period length of the current period according to the VSYNC_IN signal and VSYNC_OUT signal in the previous period.

In one embodiment, the phase discriminator 120 determines the adjustment factor for the length of the current period according to timing relationship of the VSYNC_IN signal and VSYNC_OUT signal in the previous period. FIG. 2 illustrates a timing diagram of the input signal VSYNC_IN and the output signal VSYNC_OUT of a periodic signal according to an embodiment of the present invention. It may be appreciated that FIG. 2 is only an illustrative diagram and thus is not drawn to scale. The dimensions as shown in the figure do not limit the present invention.

As shown in FIG. 2, for example the timing relationship of the VSYNC_IN signal and the VSYNC_OUT signal in the n−1$^{th}$ period is taken into account in determining the adjustment factor for the $n^{th}$ period. In FIG. 2, a rising edge of a pulse of the periodic signal is exemplarily regarded as a comparison reference. However, those skilled in the art may obviously understand that a falling edge of the pulse may also be regarded as the comparison reference.

On the one hand, when the VSYNC_IN signal in the n−1$^{th}$ period goes ahead of (or faster than) the VSYNC_OUT signal, the adjustment factor for the $n^{th}$ period is set as a negative value, e.g. −Δ. On the other hand, if the VSYNC_IN signal in the n−1$^{th}$ period lags behind (or slower than) the VSYNC_OUT signal, the adjustment factor for the $n^{th}$ period is set as a positive value, e.g., +Δ. As shown in FIG. 2, in the n−1$^{th}$ period and the $n^{th}$ period, the VSYNC_IN signal goes ahead of the VSYNC_OUT signal, so the corresponding adjustment factor for the $n^{th}$ period and n+1$^{th}$ period is set as −Δ, whereas the VSYNC_OUT signal in the n+1$^{th}$ period lags behind the VSYNC_OUT signal, so the corresponding adjustment factor for the n+2$^{th}$ period is set as +Δ.

Besides, the amplitude Δ of the above adjustment factor is predetermined depending on precision requirements for design of the system and its value is usually far smaller than one. When the amplitude Δ of the adjustment factor is larger, the period length is adjusted faster but with a low accuracy; when amplitude Δ of the adjustment factor is smaller, the period length is adjusted with a higher accuracy but adjusted more slowly. For example, when tolerance of the system for jitter in the periodic input signal is 1%, the amplitude Δ of the adjustment factor may be predetermined as 0.0001, 0.0002, etc.

The adjustor 130 is configured to determine the length of the current period of the VSYNC_OUT signal according to the estimate value for the length of the current period calculated by the frequency discriminator 110 and the adjustment factor for the length of the current period obtained by the phase discriminator 120. For example, the adjustor 130 may determine the length of the current period of the VSYNC_OUT signal according to the following formula:

$$\text{vsync\_period}(n) = \text{vsync\_period}(n)_{est} * (1 \pm \Delta) = \frac{\text{sum\_vsync\_period}(n-1)}{N} * (1 \pm \Delta) \quad \text{formula (3)}$$

wherein, vsync_period(n) is a period length of the $n^{th}$ period obtained through the calculation. When the VSYNC_IN signal in the n−1$^{th}$ period goes ahead of the VSYNC_OUT signal, the right side of the above equation takes −Δ, i.e., the period length of the $n^{th}$ period is shortened relative to the estimate value so that the obtained VSYNC_OUT signal in the $n^{th}$ period goes forward to catch up the VSYNC_IN signal; when the VSYNC_IN signal in the n−1$^{th}$ period lags behind the VSYNC_OUT signal, the right side of the above equation takes +Δ, i.e., the period length of the $n^{th}$ period gets longer relative to the estimate value so that the obtained VSYNC_OUT signal in the $n^{th}$ period goes backward to approach the VSYNC_IN signal.

Additionally, when the VSYNC_IN signal and VSYNC_OUT signal in the n−1$^{th}$ period are synchronous, the above Δ takes the value 0, i.e., the period length of the $n^{th}$ period is equal to its estimate value. This situation corresponds to a state in which the VSYNC_IN signal and VSYNC_OUT signal are locked. Under actual working conditions, this situation seldom occurs.

Other reference symbols (such as CLK, RESET) in FIG. 1 denote the same meanings as the corresponding symbols in a conventional digital phase lock loop (DPLL) and will not be detailed herein so as to avoid obscuring present invention.

It can be seen that the circuit of the apparatus 100 is completely implemented in a digital manner, thus the occupied area can be the minimum. Besides, as compared with the conventional digital phase lock loop (DPLL), a frequency multiplier needn't be implemented, and requirements on a clock are not high, for example, a conventional crystal oscillator clock (e.g., 2.4576M, or 6.144M crystal oscillator clock) can suffice.

Figure 3:
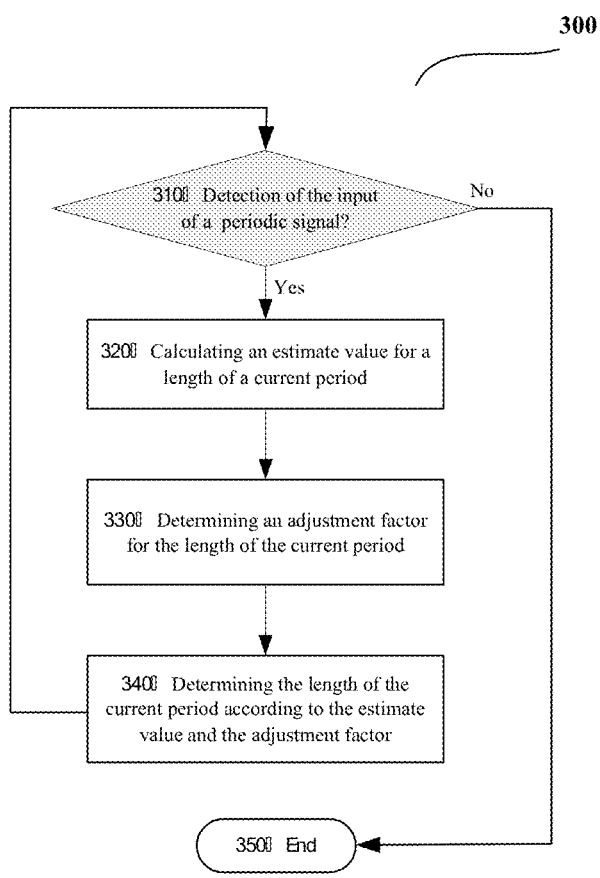
FIG. 3 illustrates a flowchart of a method for reducing jitter in a periodic signal according to an embodiment of the present invention.

FIG. 3 illustrates a flowchart of a method 300 for reducing jitter in a periodic signal according to an embodiment of the present invention. In FIG. 3, descriptions are made by also taking an example in which the vertical synchronous signal for the LED driver is a periodic signal. The method 300 may be executed by the apparatus 100 as depicted with reference to FIG. 1.

As shown in FIG. 3, the method 300 starts at step 310 of detecting input of the periodic signal VSYNC_IN. At step 320, input of the VSYNC_IN signal and feedback of the VSYNC_OUT signal are received and an estimate value for a length of a current period of the VSYNC_OUT is calculated. For example, the estimate value may be calculated according to the above formula (1). The determination of the estimate value by the frequency discriminator 110 as described above with reference to FIG. 1 also applies to the step 320.

At step 330, the input of the VSYNC_IN signal and the feedback of the VSYNC_OUT signal are received, and an adjustment factor for the period length of the current period is determined according to the VSYNC_IN signal and VSYNC_OUT signal in a previous period. For example, the adjustment factor may be determined according to timing relationship of the VSYNC_IN signal and VSYNC_OUT signal in the previous period. The determination of the adjustment factor by the phase discriminator 120 as described above with reference to FIG. 1 also applies to the step 330.

Then at step 340, the length of the current period of the VSYNC_OUT signal is determined according to the estimate value for the length of the current period as calculated at the step 320 and the adjustment factor for the length of the current period as calculated at the step 330. For example, the length of the current period may be calculated according to the above formula (3).

The length of the current period of the VSYNC_OUT signal as obtained at the step 340 may be stored for use in the calculation of the length of a next period.

The method 300 ends at step 350, for example when the input of the VSYNC_IN signal is not detected any longer.

Although the method of the present invention is described with reference to the method 300 in FIG. 3, it should be appreciated that the order of steps as illustrated in the figures and described in the description is only illustrative. Without departing from the scope of the claims, these method steps and/or actions may be executed in different orders, but not limited to the specific order as illustrated in the figures and described in the description. For example, steps 320 and 330 may be executed in a reverse order or executed simultaneously.

In one or more exemplary designs, the functions of the present application may be implemented using hardware, software, firmware, or their arbitrary combinations. In the case of implementation with software, the functions may be stored on a computer readable medium as one or more instructions or code, or transmitted as one or more instructions or code on the computer readable medium. The computer readable medium comprises a computer storage medium and a communication medium, wherein the communication medium includes any medium that helps to transmit the computer program from one place to another place. The storage medium may be any available medium accessible to a generic or a dedicated computer. The computer-readable medium may include, for example, but not limited to, RAM, ROM, EEPROM, CD-ROM or other optical disk storage device, a magnetic disk storage device, or other magnetic storage device, or any other medium that carries or stores a desired program code module in a form of instruction or data structure that is accessible to a generic or dedicated computer or a generic or dedicated processor. Besides, any connection may also be called a computer-readable medium. For example, if software is transmitted from a website, server or other remote source using a co-axial cable, an optical cable, a twisted pair wire, a digital subscriber line (DSL), or a radio technology such as infrared, radio or microwave, then the co-axial cable, optical cable, twisted pair wire, DSL, or radio technology such as infrared, radio or microwave are also covered in the definition of medium.

A general-purpose processor, digital signal processor (DSP), application-specific integrated circuit (ASIC), field programmable gate array (FPGA) or other programmable logical device, discrete gate or transistor logic, discrete hardware component or any combination of the above for performing the functions as described herein can be used to implement or execute various exemplary logic blocks, modules and circuits as described in conjunction with the present disclosure. The general-purpose processor may be a microprocessor, or the processor may also be any conventional processor, controller, microcontroller, or a state machine. The processor may be implemented as a combination of computing devices, e.g., combination of DSP and microprocessor, a plurality of microprocessors, a combination of one or more microprocessors with a DSP kernel, or any other such structure.

A person of normal skills in the art should also understand that various logical blocks, modules, circuits and algorithm steps as exemplarily depicted in conjunction with the embodiments of the present application may be implemented as electronic hardware, computer software, or a combination of both. In order to clearly express such interchangeability between hardware and software, the various exemplary components, blocks, modules, circuits and steps have been depicted in general with regard to the functions. As to whether the functions are implemented in hardware or software, it depends on a specific application and a design constraint condition applied on the whole system. Those skilled in the art may implement the depicted functions in a flexible manner for each specific application. However, such an implementation decision should not be construed as departing from the protection scope of the present invention.

The above depiction of the present disclosure is intended to enable any person of normal skills in the art to implement or use the present invention. For a person of normal skills in the art, various modifications of the present disclosure are obvious, and the general principle as defined herein may also be applied to other variants without departing from the spirit and protection scope of the present invention. Thus, the present invention is not limited to the instances and designs as described herein, but consistent with the broadest scope of the principle and novel characteristics of the present disclosure.

What is claimed is:

1. An apparatus for reducing jitter in an input signal the periods of which might have jitter, comprising:
   a frequency discriminator implemented in a first digital circuit portion, including a proportion integration differentiation (PID) controller, configured to receive the input signal and feedback of an output signal of the apparatus and calculate an estimate value for a length of a current period of the input signal;
   a phase discriminator implemented in a second digital circuit portion, configured to receive the input signal and determine, based upon the input signal in a previous period and the output signal in the previous period, an adjustment factor for the length of the current period of the input signal; and an adjustor implemented in a third digital circuit portion, configured to determine, based upon the estimate value for the length of the current period and the adjustment factor for the length of the current period, a period length of the output signal in the current period to reduce jitter in the input signal.

2. The apparatus according to claim 1, wherein the frequency discriminator is further configured to calculate an average value for period lengths of first N periods of the input signal in an initialization phase of the apparatus to obtain an initial value of the estimate value, wherein N is an integer greater than 1, and N is pre-set depending on precision requirements for design of the apparatus.

3. The apparatus according to claim 2, wherein the N is one of 512, 1024, 2048 and 4096.

4. The apparatus according to claim 2, wherein the frequency discriminator is further configured to recursively calculate the estimate value for the length of the current period based upon a length of a previous period of the input signal and a length of a previous period of the output signal after the initialization phase of the apparatus.

5. The apparatus according to claim 1, wherein the phase discriminator is configured to set the adjustment factor for the current period as a negative value when the input signal in the previous period goes ahead of the output signal in the previous period, and to set the adjustment factor for the current period as a positive value when the input signal in the previous period lags behind the output signal in the previous period.

6. The apparatus according to claim 5, wherein an amplitude of the adjustment factor is predetermined depending on precision requirements for design of the apparatus.

7. The apparatus according to claim 1, wherein the input signal is a vertical synchronous signal for a light emitting diode driver.

8. A method for reducing jitter in an input signal the periods of which might have jitter by using an apparatus, the apparatus comprising a frequency discriminator implemented in a first digital circuit portion and including a proportion integration differentiation (PID) controller, a phase discriminator implemented in a second digital circuit portion, and an adjustor implemented in a third digital circuit portion, the method comprising:

receiving, by the frequency discriminator, the input signal and feedback of an output signal of the apparatus and calculating, by the frequency discriminator, an estimate value for a length of a current period of the input signal;

receiving, by the phase discriminator, the input signal and determining, by the phase discriminator, based upon the input signal in a previous period and the output signal in the previous period, an adjustment factor for the length of the current period of the input signal; and determining, by the adjustor, based upon the estimate value for the length of the current period and the adjustment factor for the length of the current period, a period length of the output signal in the current period to reduce jitter in the input signal.

9. The method according to claim 8, wherein said calculating, by the frequency discriminator, an estimate value for a length of a current period of the input signal further comprises: calculating, by the frequency discriminator, an average value for period lengths of first N periods of the input signal in an initialization phase to obtain an initial value of the estimate value, wherein N is an integer greater than 1, and N is pre-set depending on precision requirements for design of the apparatus.

10. The method according to claim 9, wherein the N is one of 512, 1024, 2048 and 4096.

11. The method according to claim 9, wherein said calculating, by the frequency discriminator, an estimate value for a length of a current period of the input signal further comprises: recursively calculating, by the frequency discriminator, the estimate value for the length of the current period based upon a length of a previous period of the input signal and a length of a previous period of the output signal after the initialization phase.

12. The method according to claim 8, wherein said determining, by the phase discriminator, an adjustment factor for the length of the current period of the input signal further comprises: setting, by the phase discriminator, the adjustment factor for the current period as a negative value when the input signal in the previous period goes ahead of the output signal in the previous period, and setting the adjustment factor for the current period as a positive value when the input signal in the previous period lags behind the output signal in the previous period.

13. The method according to claim 12, wherein an amplitude of the adjustment factor is predetermined depending on precision requirements for design of the apparatus.

14. The method according to claim 8, wherein the input signal is a vertical synchronous signal for a light emitting diode driver.

* * * * *